United States Patent
Suzuki et al.

(10) Patent No.: US 8,520,111 B2
(45) Date of Patent: Aug. 27, 2013

(54) SOLID-STATE IMAGING DEVICE INCLUDING A PLURALITY OF UNITS EACH HAVING A CORNER REGISTER

(75) Inventors: Hisanori Suzuki, Hamamatsu (JP); Yasuhito Yoneta, Hamamatsu (JP); Shin-ichiro Takagi, Hamamatsu (JP); Kentaro Maeta, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 11 days.

(21) Appl. No.: 13/147,046

(22) PCT Filed: Jan. 22, 2010

(86) PCT No.: PCT/JP2010/050776
§ 371 (c)(1),
(2), (4) Date: Aug. 26, 2011

(87) PCT Pub. No.: WO2010/087277
PCT Pub. Date: Aug. 5, 2010

(65) Prior Publication Data
US 2011/0298958 A1 Dec. 8, 2011

(30) Foreign Application Priority Data
Jan. 30, 2009 (JP) ................ P2009-020465

(51) Int. Cl.
*H04N 3/14* (2006.01)
*H04N 5/335* (2006.01)

(52) U.S. Cl.
USPC .......................................... 348/311; 348/321

(58) Field of Classification Search
USPC .................... 348/303, 311, 321, 323
See application file for complete search history.

(56) References Cited

U.S. PATENT DOCUMENTS

| 6,444,968 B1 * | 9/2002 | Burt et al. ............... 348/303 |
| 2003/0042400 A1 | 3/2003 | Hynecek |
| 2004/0150737 A1 * | 8/2004 | Pool et al. ............... 348/311 |
| 2006/0055802 A1 * | 3/2006 | Parks ............... 348/311 |
| 2008/0239129 A1 | 10/2008 | Oshima et al. |

FOREIGN PATENT DOCUMENTS

| CN | 101277374 | 10/2008 |
| EP | 1 755 167 | 2/2007 |
| JP | 10-304256 | 11/1998 |
| JP | 2002-369081 | 12/2002 |
| JP | 2003-18467 | 1/2003 |
| JP | 2004-523112 | 7/2004 |
| JP | 2005-64304 | 3/2005 |
| JP | 3862850 | 10/2006 |
| JP | 2007-124675 | 5/2007 |
| JP | 2008-252790 | 10/2008 |
| WO | 02/058157 | 7/2002 |

* cited by examiner

*Primary Examiner* — Gevell Selby
(74) *Attorney, Agent, or Firm* — Drinker Biddle & Reath LLP

(57) ABSTRACT

A solid-state imaging device according to one embodiment is a multi-port solid-state imaging device, and includes an imaging region and a plurality of units. The imaging region includes a plurality of pixel columns. The units generate signals based on charges from the imaging region. Each of the units has an output register, a plurality of multiplication registers, and an amplifier. The output register transfers a charge from one or more corresponding pixel columns out of the plurality of pixel columns. The multiplication registers are provided in parallel, and receive the charge from the output register to generate multiplied charges individually. The amplifier generates a signal based on the multiplied charges from the multiplication registers.

1 Claim, 1 Drawing Sheet

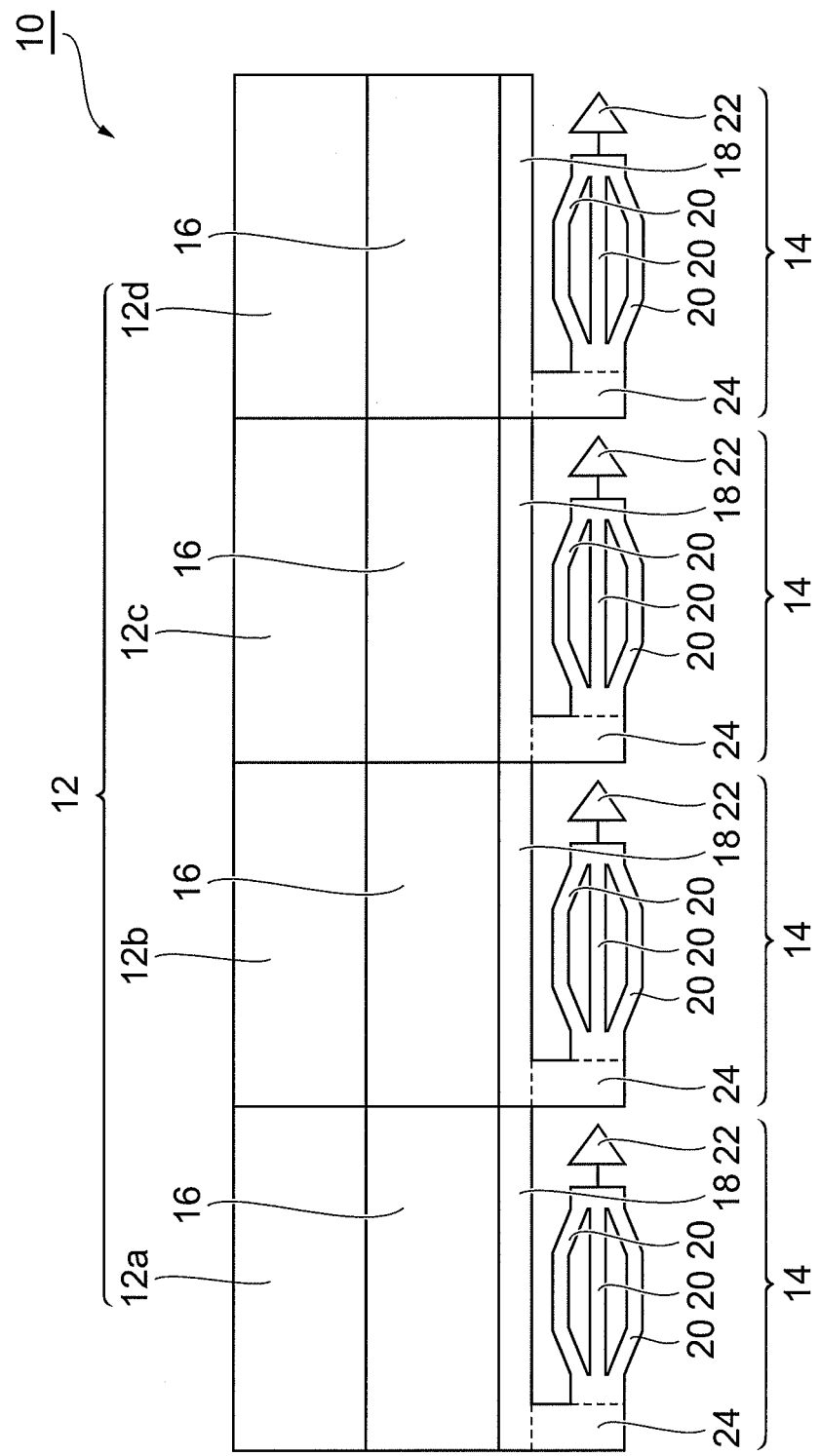

(12)United States Patent

SOLID-STATE IMAGING DEVICE INCLUDING A PLURALITY OF UNITS EACH HAVING A CORNER REGISTER

TECHNICAL FIELD

The present invention relates to a multi-port type and charge multiplying type of solid-state imaging device.

BACKGROUND ART

Among solid-state imaging devices, there are multi-port and charge multiplying solid-state imaging devices as described in Japanese Patent Laid-Open No. 2007-124675 and Japanese Patent No. 3862850. Such solid-state imaging devices include an imaging region and a plurality of units. The imaging region includes a plurality of pixel columns. Each of the units has an output register that transfers a charge from one or more corresponding pixel columns out of the pixel columns, a multiplication register that receives the charge transferred by the output register to generate a multiplied charge, and an amplifier that generates a signal based on the multiplied charge from the multiplication register.

CITATION LIST

Patent Literature

Patent Literature 1: Japanese Patent Laid-Open No. 2007-124675
Patent Literature 2: Japanese Patent No. 3862850

SUMMARY OF INVENTION

Technical Problem

It is desired for a multi-port and charge multiplying solid-state imaging devices to reduce variation in gain of multiplication registers in all units. However, it has been generally difficult due to various factors such as production tolerances to suppress variation in gain among the units.

It is an object of the present invention to provide a multi-port and charge multiplying solid-state imaging device that outputs from a plurality of units signals based on charges from an imaging region, and that is capable of reducing variation in gain among the units.

Solution to Problem

A solid-state imaging device of the present invention is a multi-port solid-state imaging device, and includes an imaging region and a plurality of units. The imaging region includes a plurality of pixel columns. The units generate signals based on charges from the imaging region. Each of the units has an output register, a plurality of multiplication registers, and an amplifier. The output register transfers a charge from one or more corresponding pixel columns out of the plurality of pixel columns. The multiplication registers are arranged in parallel, and receive the charge from the output register to generate multiplied charges individually. The amplifier generates a signal based on the multiplied charges from the multiplication registers.

According to this solid-state imaging device, since each of the units forming multiple ports has a plurality of multiplication registers provided in parallel, even if there is a variation in gain among the multiplication registers, the gain of each unit is averaged. Consequently, the variation in gain among the units is reduced.

Advantageous Effects of Invention

As has been described above, according to the present invention, a multi-port and charge multiplying solid-state imaging device that outputs from a plurality of units signals based on charges from an imaging region, and that is capable of reducing variation in gain among the units is provided.

BRIEF DESCRIPTION OF DRAWINGS

FIG. 1 is a view showing a solid-state imaging device according to an embodiment.

DESCRIPTION OF EMBODIMENTS

Hereinafter, a preferred embodiment of the present invention will be described in detail with reference to the drawings.

FIG. 1 is a view showing a solid-state imaging device according to an embodiment. The solid-state imaging device 10 shown in FIG. 1 includes an imaging region 12, and a plurality of units 14.

The imaging region 12 is a region that generates charges in response to incident light. Specifically, the imaging region 12 includes a plurality of pixels arrayed two-dimensionally, and each pixel includes a photodiode.

The solid-state imaging device 10 of the present embodiment includes charge accumulating regions 16 as well as the imaging region 12. The charge accumulating region 16 is a section that temporarily accumulates charges generated by the imaging region 12 before transferring the charges to output registers described later. The solid-state imaging device 10 having such charge accumulating regions 16 is called a frame transfer CCD image sensor. However, the solid-state imaging device of the present invention may be an interline CCD image sensor or a full-frame transfer CCD image sensor.

The imaging region 12 has a plurality of areas 12a to 12d. The areas 12a to 12d are arranged in the horizontal direction, and a plurality of pixel columns are included in each area. Charges generated by the areas 12a to 12d are output to corresponding units 14. In addition, the imaging region 12 of the solid-state imaging device 10 contains four areas, that is, the solid-state imaging device 10 is a 4-port solid-state imaging device. However, the number of ports of the solid-state imaging device of the present invention is not limited to four.

Each of the units 14 has an output register 18, a plurality of multiplication registers 20, and an amplifier 22. In the present embodiment, each of the units 14 further may include a corner register 24.

The output register 18 is a transfer register that receives a charge generated by a corresponding area of the imaging region 12 and then transferred in the vertical direction to transfer the charge in the horizontal direction. The corner register 24 is a transfer register that transfers a charge like the output register 18. The corner register 24 is provided between the output register 18 and the multiplication register 20. The corner register 24 transfers a charge transferred by the output register 18 to the multiplication register 20.

The multiplication registers 20 are each a register that multiplies a charge by an impact ionization effect, and transfers the multiplied charge. In the present embodiment, each unit has three multiplication registers. However, in the solid-state imaging device of the present invention, each unit may have two or more multiplication registers.

In the solid-state imaging device 10, the multiplication registers 20 are provided in parallel between the output register 18 and the amplifier 22. These multiplication registers 20 receive via the corner register 24 a charge transferred from the output register 18, and output multiplied charges to the amplifier 22.

The amplifier 22 receives charges multiplied by the multiplication registers 20 to perform charge-voltage conversion, and generates a signal according to the amount of the received charges. As the amplifier 22, a floating diffusion amplifier may be used.

According to the solid-state imaging device 10 described above, a signal based on charges multiplied by the multiplication registers 20 provided in parallel are output from the amplifier 22. Therefore, even if the multiplication registers 20 have variation in their gains, the gain of each unit 14 is averaged. Consequently, the variation in gain among the units 14 is reduced. Hence, images to be obtained by the solid state-imaging device 10 are high quality.

REFERENCE SIGNS LIST

10 . . . Solid-state image imaging device, 12 . . . Imaging region, 14 . . . Unit, 16 . . . Charge accumulating region, 18 . . . Output register, 20 . . . Multiplication register, 22 . . . Amplifier, 24 . . . Corner register.

The invention claimed is:
1. A multi-port solid-state imaging device comprising:
an imaging region including a plurality of pixel columns; and
a plurality of units that generate signals based on charges from the imaging region,
each of the units having:
an output register that transfers a charge from one or more corresponding pixel columns out of the plurality of pixel columns;
a corner register that transfers a charge transferred from the output register;
a plurality of multiplication registers that receive the charge from the corner register to generate multiplied charges individually, the corner register being provided between the output register and the plurality of multiplication registers, and the multiplication registers being directly connected to the corner register and being arranged in parallel; and
an amplifier that generates a signal based on the multiplied charges from the plurality of multiplication registers.

* * * * *

UNITED STATES PATENT AND TRADEMARK OFFICE
CERTIFICATE OF CORRECTION

PATENT NO.       : 8,520,111 B2                                     Page 1 of 1
APPLICATION NO. : 13/147046
DATED            : August 27, 2013
INVENTOR(S)      : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 70 days.

Signed and Sealed this

Fifteenth Day of September, 2015

Michelle K. Lee
*Director of the United States Patent and Trademark Office*